(12) United States Patent
Mangrum (10) Patent No.: US 8,633,575 B1
(45) Date of Patent: Jan. 21, 2014

(54) IC PACKAGE WITH INTEGRATED ELECTROSTATIC DISCHARGE PROTECTION

(75) Inventor: Marc Alan Mangrum, Manchaca, TX (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 13/479,829

(22) Filed: May 24, 2012

(51) Int. Cl.
- H01L 23/495 (2006.01)
- H01L 23/48 (2006.01)
- H01L 23/52 (2006.01)

(52) U.S. Cl.
USPC .................. 257/676; 257/692; 257/E23.023; 257/E23.08

(58) Field of Classification Search
USPC ..................... 257/676, 692, E23.023, E23.08; 361/220
See application file for complete search history.

(56) References Cited

U.S. PATENT DOCUMENTS

| | | | | |
|---|---|---|---|---|
| 5,877,043 A * | 3/1999 | Alcoe et al. | | 438/123 |
| 6,225,685 B1 * | 5/2001 | Newman et al. | | 257/666 |
| 6,225,700 B1 * | 5/2001 | Ito et al. | | 257/780 |
| 6,258,629 B1 * | 7/2001 | Niones et al. | | 438/111 |
| 6,285,075 B1 * | 9/2001 | Combs et al. | | 257/675 |
| 6,407,895 B1 | 6/2002 | Capps | | |
| 6,538,306 B1 * | 3/2003 | Inada et al. | | 257/666 |
| 6,700,189 B2 * | 3/2004 | Shibata | | 257/684 |
| 6,713,850 B1 * | 3/2004 | Yuan et al. | | 257/668 |
| 6,867,071 B1 * | 3/2005 | Lee et al. | | 438/123 |
| 6,876,068 B1 * | 4/2005 | Lee et al. | | 257/676 |
| 7,030,469 B2 * | 4/2006 | Mahadevan et al. | | 257/659 |
| 7,132,315 B2 * | 11/2006 | Minamio et al. | | 438/123 |
| 7,215,009 B1 * | 5/2007 | Leng et al. | | 257/667 |
| 7,560,804 B1 * | 7/2009 | Glenn | | 257/666 |
| 7,808,084 B1 * | 10/2010 | Lee et al. | | 257/666 |
| 7,812,431 B2 * | 10/2010 | Yang et al. | | 257/676 |
| 7,989,933 B1 * | 8/2011 | Kim et al. | | 257/676 |
| 8,184,453 B1 * | 5/2012 | Kim et al. | | 361/813 |
| 8,188,579 B1 * | 5/2012 | Kim et al. | | 257/666 |
| 8,318,287 B1 * | 11/2012 | Glenn | | 428/123 |
| 2002/0027297 A1 * | 3/2002 | Ikenaga et al. | | 257/784 |
| 2003/0073265 A1 * | 4/2003 | Hu et al. | | 438/123 |
| 2004/0027779 A1 * | 2/2004 | Byrne et al. | | 361/220 |
| 2004/0056337 A1 * | 3/2004 | Hasebe et al. | | 257/667 |
| 2004/0080025 A1 * | 4/2004 | Kasahara et al. | | 257/666 |
| 2004/0159918 A1 * | 8/2004 | Lee | | 257/670 |
| 2005/0242415 A1 * | 11/2005 | Abraham | | 257/659 |
| 2006/0060951 A1 * | 3/2006 | Ise | | 257/674 |
| 2010/0207268 A1 | 8/2010 | Chen et al. | | |
| 2010/0308453 A1 * | 12/2010 | Scheid et al. | | 257/698 |
| 2011/0140250 A1 * | 6/2011 | Lee | | 257/670 |

FOREIGN PATENT DOCUMENTS

| | | |
|---|---|---|
| JP | 09045194 A | 2/1997 |
| JP | 10242378 A | 9/1998 |
| KR | 20050075457 | 7/2005 |

* cited by examiner

Primary Examiner — David S Blum (57) ABSTRACT

There is disclosed an integrated circuit (IC) package or semiconductor package including integrated spark or arc gaps which are uniquely configured to reduce the susceptibility of the package to being damaged from an electrostatic discharge (ESD) event. In an exemplary embodiment, each arc gap is collectively defined by an arc gap extension integrally connected to and protruding from the die pad of the package, and a corresponding lead thereof.

20 Claims, 4 Drawing Sheets

IC PACKAGE WITH INTEGRATED ELECTROSTATIC DISCHARGE PROTECTION

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices and, more particularly, to an integrated circuit (IC) package or semiconductor package including integrated spark or arc gaps which are uniquely configured to reduce the susceptibility of the package to being damaged from an electrostatic discharge (ESD) event.

2. Description of the Related Art

Many modern applications for semiconductor packages target environments where the package is exposed to intense electromagnetic fields that can lead to electrostatic discharge (ESD) events which are known to damage the normal operation thereof. Currently, a large market for manufactured semiconductor package is appliances, both residential and commercial. These particular applications typically pose unique challenges, especially those that expose the package to strong electromagnetic fields and eddy current induced magnetic fields. Often, these fields are strong enough to create an electrostatic discharge that dissipates through the application printed circuit board (PCB) or even within the interior of a semiconductor package, thus damaging or affecting the operation thereof and/or other devices in the application. Along these lines, imperfections in normal printed circuit board or silicon die manufacturing will periodically produce devices that are imperfect, and susceptible to damage when exposed to static electric and high current fields. ESD problems are also increasing in the electronics industry as a result of the trends toward higher speed and smaller semiconductor device or package sizes.

In general terms, an electrostatic discharge or ESD event is the sudden transition of electric current that flows between two objects at different electrical potential. In terms of semiconductor packages, ESD also refers to momentary, unwanted currents that may cause damage to the semiconductor package and/or the application including the same. ESD is often considered a subset of a more general range of failures associated with electrical over stress (EOS) which is the most frequently occurring failure mode in semiconductor packages of all types. However, EOS is generally associated with over-voltage and over-current stress of rather long time durations, which typically occur during normal circuit operation, screening or test conditions. On the other hand, an ESD event is typically viewed in terms of short, fast and high amplitude pulses that are an inevitable part of the day to day environment. In this regard, ESD is often viewed as a miniature spark of charge that moves between two surfaces that have different potentials. It can occur only when the voltage differential between the two surfaces is sufficiently high to break down the dielectric strength of the medium separating the two surfaces. When a static charge moves within the environment of a semiconductor package, it becomes a current that often damages or destroys gate oxide, metallization, and junctions. The four most common causes of ESD in the context integrated circuit packages or semiconductor packages are a charged body touching the package, a charged package touching a grounded surface, a charged machine touching a package, or an electrostatic field inducing a voltage across a dielectric of the package sufficient to break it down.

In view of the foregoing, various methods have been implemented in the electronic arts to dissipate or null the effects of an ESD event on a semiconductor package. More particularly, in applications where exposure to strong electromagnetic fields is anticipated, extreme and costly measures are often employed to protect the semiconductor package from damage. Exemplary methods for protecting semiconductor packages from ESD damage when exposed to electrostatic charges include incorporating modifications to the PCB design and/or interconnect methods employed to the board level. These "contact points" expose the application PCB and semiconductor package(s) to the external environment and, hence, any electrostatic discharge events that may occur. Though often effective, these techniques typically only address the case where the stray charges enter an application as a result of human contact.

In another example, specialized ESD circuits (smart fuses) are incorporated into the PCB design to protect the more sensitive circuits from ESD voltages that often occur in the Vdd and Vss supply lines to the PCB. These devices are useful, but add cost to the application PCB and do not offer much protection for field induced ESD events. Other solutions take the form of metal shields interfaced to the semiconductor package(s) or multiple ground plane layers in the PCB.

In other situations, exotic ESD circuits are included in the design of the integrated circuit (IC) or semiconductor die of the semiconductor package. The performance of the ESD circuits is typically measured in what is known as the human body model (HBM) and the machine model (MM). The HBM is the most commonly used model for characterizing the susceptibility of an electronic device to damage from electrostatic discharge, and is a simulation of the discharge which might occur when a human touches an electronic device. The MM simulates a machine discharging accumulated static charge through a device to ground, and is often used in a semiconductor package ESD sensitivity test to simulate a discharge from a large metal machine part, trolley, or object that has become charged to a high voltage. However, ESD circuit designs are typically complex and occupy a considerable amount of die area. They also vary widely in their effectiveness and ability to protect a semiconductor die exposed to an ESD event. Further, as the design technology nodes continue to shrink, so does the effectiveness of these circuits. Along these lines, one of the most common methods utilized for ESD protection of sensitive IC's is the "on chip" method wherein ESD protection is built into the die design and is sized for the wafer technology node being utilized therein. However, a limitation with this method is the die size impact, especially for more advanced nodes of 40 nm and below. Additionally, the use of low k and ultra-low k dielectric materials reduces the effectiveness the ESD protection while requiring additional layers and area to implement. Thus, depending upon the desired protection level, these designs can take considerable amount die area. Further, placement of unrelated circuits near an I/O pad may causes unexpected current paths through interactions and may render the protection circuit ineffective.

The present invention addresses the foregoing issues by integrating spark or arc gaps into the design of the semiconductor package. As a result of such integration, the probability of damage to the integrated circuit or semiconductor die is significantly diminished, thus extending its ability to function in applications that previously were not considered in relation thereto. In addition, by enabling this feature at the package level, more costly solutions for ESD protection can be avoided, further extending the market value for the semiconductor package or device. These, as well as other features and advantages of the present invention will be described in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
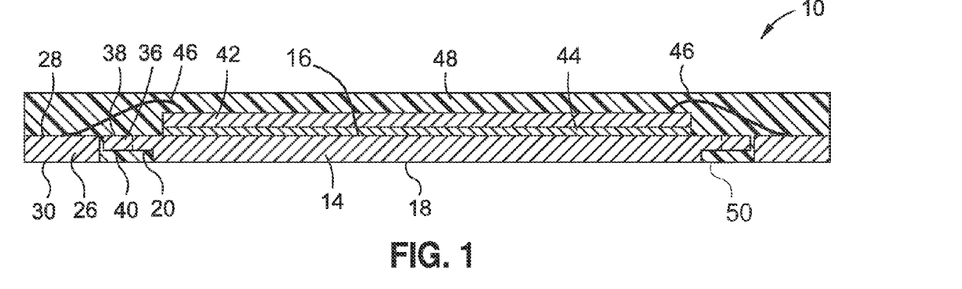
FIG. 1 is a cross-sectional view of a semiconductor package constructed in accordance with a first embodiment of the present invention.
Figure 2:
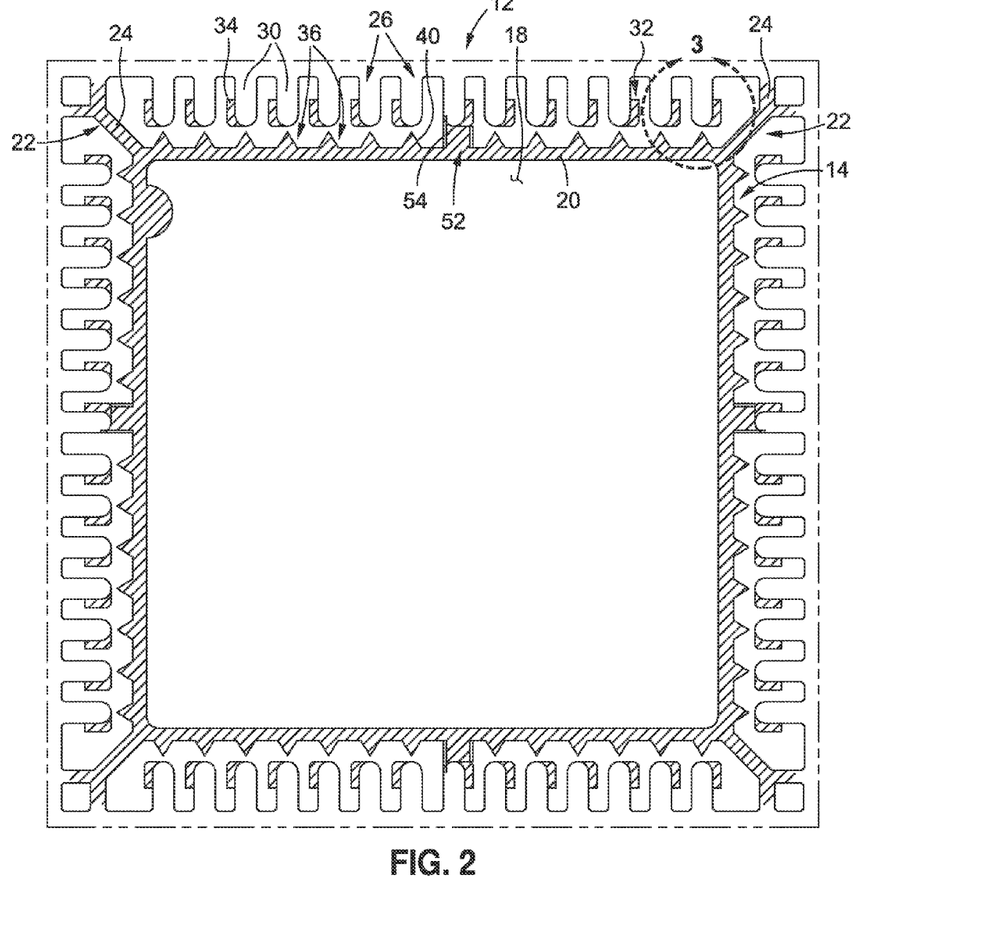
FIG. 2 is a bottom plan view of the unsingulated leadframe integrated into the semiconductor package shown in FIG. 1.
Figure 3:
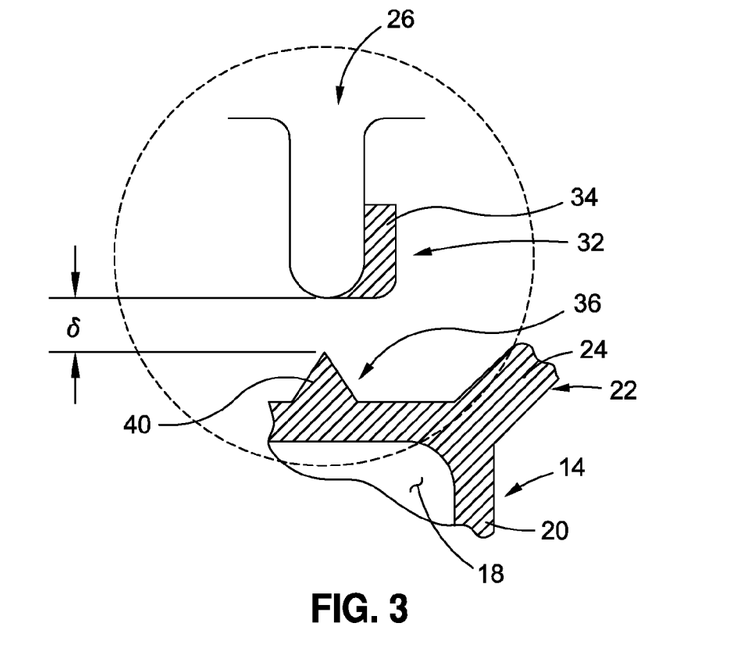
FIG. 3 is an enlargement of the encircled region 3 shown in FIG. 2.

Referring now to the drawings wherein the showings are for purposes of illustrating preferred embodiments of the present invention only, and not for purposes of limiting the same, FIGS. 1-3 depict a semiconductor package 10 constructed in accordance with a first embodiment of the present invention. One of the structural features of the semiconductor package 10 is its leadframe 12. The leadframe 12 comprises a die paddle or die pad 14 which has a generally quadrangular configuration, and defines four peripheral edge segments. When viewed from the perspective shown in FIG. 1, the die pad 14 also defines a generally planar top surface 16, and an opposed, generally planar bottom surface 18. In the process of fabricating the leadframe 12, the die pad 14 is preferably subjected to a partial etching process which facilitates the formation of a recessed shoulder or shelf 20 therein. The shelf 20 substantially circumvents the bottom surface 18 of the die pad 14, and is disposed in opposed relation to the peripheral portion of the top surface 16 thereof. The depth of the shelf 20 is preferably about one-half of the total thickness of the die pad 14 (i.e., the distance separating the top and bottom surfaces 16, 18 from each other). The functionality of the shelf 20 will be discussed in more detail below.

The leadframe 12 also includes a plurality of tie bars 22 which are integrally connected to and extend diagonally from respective ones of the four corner regions defined by the die pad 14. Each of the tie bars 22 defines a generally planar top surface which extends in generally coplanar relation to the top surface 16 of the die pad 14. During the fabrication of the leadframe 12, each of the tie bars 22 is preferably subjected to a partial etching process which results in each of the tie bars 22 defining an etched bottom surface 24 which extends in generally coplanar relation to the shelf 20.

In addition to the die pad 14 and tie bars 22, the leadframe 12 comprises a plurality of leads 26. In the leadframe 12, the leads 26 are preferably segregated into four sets, with each set of the leads 26 extending along and in spaced relation to a respective one of the peripheral edge segments defined by the die pad 14. Each of the leads 26 defines a generally planar top surface 28 and an opposed, generally planar bottom surface 30. The top surface 28 extends in generally coplanar relation to the top surface 16 of the die pad 14, as well as the top surfaces of the tie bars 22. The bottom surface 30 of each lead 24 extends in generally coplanar relation to the bottom surface 18 of the die pad 14.

As will be discussed in more detail below, the leads 26 may be formed to have any one of a multiplicity of differing shapes or configurations. In the exemplary embodiment shown in FIGS. 1-3, each of the leads 26 is subjected to a partial etching process which results in its inclusion of a locking tab portion 32 which protrudes laterally from one of the side surfaces thereof. The locking tab portion 32 of each lead 26 is preferably about one-half of the total thickness thereof (i.e., the distance separating the top and bottom surfaces 28, 30 from each other). Each locking tab portion 32 defines a generally planar top surface which extends in substantially coplanar relation to the top surface 28 of the corresponding lead 26 and to the top surface 16 of the die pad 14. Each locking tab portion 32 further defines an etched bottom surface 34 which extends in generally coplanar relation to the shelf 20 and the etched bottom surfaces 24 of the tie bars 22.

As further seen in FIGS. 1-3, in the leadframe 12, each of the four peripheral edge segments of the die pad 14 does not have a linear, uninterrupted configuration. Rather, the partial etching process to which the die pad 14 is subjected as facilitates the formation of the above-described shelf 20 therein further preferably facilitates the formation of a multiplicity of spark or arc gap extensions 36 which protrude from the peripheral edge segments thereof. More particularly, as best seen in FIG. 2, the arc gap extensions 36 each preferably have a generally triangular configuration, and are segregated into four sets, with each set of the arc gap extensions 36 protruding from a respective one of the four peripheral edge segments defined by the die pad 14. Each of the arc gap extensions 36 defines a generally planar top surface 38 which extends in substantially co-planar relation to the top surface 16 of the die pad 14, as well as the top surfaces 28 of the leads 26. Each arc gap extension 36 further defines an etched bottom surface 40 which extends in generally co-planar relation to the shelf 20 and the etched bottom surfaces 24, 34 of the tie bars 22 and locking tab portions 32 of the leads 26.

In the leadframe 12, the tip or apex of each arc gap extension 36 is directed toward or points to the approximate center of the distal, inner end of a corresponding lead 26, but is separated therefrom by a prescribed arc gap $\delta$. The number of arc gap extensions 36 included in each set thereof may be equal to the number of leads 26 included in each corresponding set thereof. However, as seen in FIG. 2, it is also contemplated that the leadframe 12 may be formed such that all but one of the leads 26 of each set thereof is aligned with a corresponding arc gap extension 36 and separated therefrom by a corresponding arc gap $\delta$. In this regard, in FIG. 2, the leadframe 12 is formed such that a centrally positioned lead 26 of each set thereof is not aligned with an arc gap extension 36, but rather is integrally connected to a corresponding peripheral edge segment of the die pad 14 by a fusing bar 52. Each fusing bar 52 defines a generally planar top surface which extends in substantially co-planar relation to the top surface 16 of the die pad 14, as well as the top surfaces 28 of the leads 26. Each fusing bar 52 further defines an etched bottom surface 54 which extends in generally co-planar relation to the shelf 20 and the etched bottom surfaces 24, 34, 40 of the tie bars 22, locking tab portions 32 of the leads 26, and arc gap extensions 36. The fusing bar(s) 52, if included in the leadframe 12, allow the die pad 14 to be shorted to a specific lead 26 or leads 26. The functionality of the arc gaps δ in the completed semiconductor package 10 will be described in more detail below.

In the semiconductor package 10 it is contemplated that the leadframe 12 will be fabricated from a copper-based material, a copper alloy-based material, steel, non-ferrous, or an alloy material such as Alloy 42 having suitable conductive metal plating layers applied thereto. As such, the top and bottom surfaces 16, 18 of the die pad 14, the top and bottom surfaces 28, 30 of each of the leads 26, and the top surfaces of each of the tie bars 22 may be defined by one of the plating layers applied to the underlying copper, copper alloy or Alloy 42 material. When the leadframe 12 is in its unsingulated state, the tie bars 22 each extend and are integrally connected to a peripheral dambar (not shown) which circumvents the die pad 14. As such, the tie bars 22 effectively support the die pad 14 within the interior of the dambar. Each set of the leads 26 is also integrally connected to and protrudes generally perpendicularly from a corresponding peripheral segment of the dambar toward a corresponding peripheral edge segment of the die pad 14. As will be recognized, in the completed semiconductor package 10 the dambar is ultimately singulated or removed from the leadframe 12, thus effectively electrically isolating the leads 26 from each other and from the die pad 14. However, one or more of the leads 26 may be maintained in electrical contact with the die pad 14 with the inclusion of one or more of the above-described fusing bars 52 within the leadframe 12.

In addition to the leadframe 12, the semiconductor package 10 comprises an integrated circuit or semiconductor die 42 which is attached to the top surface 16 of the die pad 14. More particularly, the semiconductor die 42 defines opposed, generally planar top and bottom surfaces, with the bottom surface of the semiconductor die 42 being attached to a central portion of the top surface 16 of the die pad 14 through the use of a layer 44 of a suitable adhesive, such as a conductive or non-conductive epoxy or a conductive or non-conductive die attach film. Disposed on a peripheral portion of the top surface of the semiconductor die 42 is a plurality of conductive terminals, at least some of which are electrically connected to respective ones of the leads 26 through the use of conductive wires 46. It is contemplated that for those terminals electrically connected to the leads 26, the corresponding wires 46 will extend between the terminals and the top surfaces 28 of corresponding ones of the leads 26. Though not shown in FIG. 1, it is also contemplated that wires 46 may be used to facilitate the electrical connection of one or more of the terminals to a peripheral portion of the top surface 16 of the die pad 14 to provide a grounding function.

In the semiconductor package 10, portions of the leadframe 12, and in particular the die pad 14, tie bars 22, leads 26, locking tab portions 32, arc gap extensions 36 and fusing bars 52 thereof, are covered by an encapsulant material which ultimately hardens into a package body 48 of the semiconductor package 10. The semiconductor die 42 and the wires 46 are also covered by the encapsulant material, and hence the fully formed package body 48. When the encapsulant material used to form the package body 48 is initially applied to the leadframe 12, such encapsulant material, in addition to covering exposed portion of the top surface 16 of the die pad 14, also flows over and covers the side surface of the thereof, as well as the shelf 20 and the totality of the arc gap extensions 36 protruding therefrom (including the etched bottom surfaces 40). The encapsulant material also covers the top surfaces 28 of the leads 26, the side and inner end surfaces thereof, and the totality of the locking tab portions 32 protruding therefrom (including the etched bottom surfaces 34). Also covered by the encapsulant material is the tie bars 22 (including the top surfaces and the etched bottom surfaces 24 thereof), as well as the fusing bars 52 (including the top surfaces and the etched bottom surfaces 54 thereof). The encapsulant material also flows between adjacent pairs of the leads 26, between the leads 26 and the tie bars 22, and between the leads 26 and the die pad 14 (including the arc gaps δ between the leads 26 and the arc gap extensions 36).

However, in the exemplary semiconductor package 10 shown in FIG. 1, the encapsulant material does not cover the bottom surface 18 of the die pad 14, or the bottom surfaces 30 of the leads 26. As such, the fully formed package body 48 defines a bottom surface 50 which extends in generally co-planar relation to the bottom surface 18 of the die pad 14 and the bottom surfaces 30 of the leads 26. Advantageously, the flow of the encapsulant material used to form the package body 48 over the shelf 20, the arc gap extensions 36, fusing bars 52 and the locking pad portions 32 creates an effective mechanical interlock between the die pad 14, leads 26 and package body 48.

In the completed semiconductor package 10, the arc gaps δ provide an alternate path for dissipating energy from an ESD event created when the semiconductor package 10 is exposed to an energy field. The arc gaps δ completely circumvent the periphery of the die pad 14, and hence the semiconductor die 42 attached thereto. However, those of ordinary skill in the art will recognize that the die pad 14 may be formed such that the number of arc gap extensions 36 included thereon is less than the number of leads 26, with only certain select leads 26 of the semiconductor package 10 thus having an arc gap extension 36 aligned therewith. In this regard, for certain applications, it may be desirable to include an arc gap δ adjacent only input sensitive leads 26 of the semiconductor package 10. This has potential of reducing the complexity of the design of the leadframe 12 without compromising the added benefit of protecting the semiconductor due 42 from an ESD event. The efficacy of the arc gaps δ for ESD dissipation is supported by principles regarding the dielectric breakdown of air as defined by Paschen's Law (defined by the equation $V=f\{\rho\delta\}$) or the Paschen curve. The curve is usually written as a graph of breakdown voltage V versus the product of gas density (sometimes referred to as pressure p) and the size of the arc gap δ. It should be noted that while the curve is defined by the function of the gas density and the size of the arc gap δ, many other factors such as radiation, dust, surface irregularities and humidity have an effect of the breakdown of any arc gap δ. Along these lines, in the semiconductor package 10, the size or width of each arc gap δ can be simulated and designed to accommodate the specific needs of the semiconductor package 10 and the application which will ultimately include the same.

Those of ordinary skill in the art will recognize that each of the arc gap extensions 36 included in the leadframe 12 may potentially have a configuration other than for the above-described triangular shape without departing from the spirit and scope of the present invention. Further, it is also contemplated that each of the arc gap extensions 36 need not necessarily be partially etched to define the etched bottom surface 40, but rather may have a thickness equaling that of the die pad 14 between the top and bottom surfaces 16, 18 thereof. In this instance, the bottom surfaces of the arc gap extensions 36 may extend in generally co-planar relation to the bottom surfaces 18, 30 of the die pad 14 and leads 26, and further may be exposed in the bottom surface 50 of the package body 48. Further, as indicated above, the particular structural features of the semiconductor package 10 including the leadframe 12 outfitted with the arc gap extensions 36 is intended to be exemplary only. In this regard, a leadframe having ESD dissipating structures such as the arch gap extensions 36 formed on the die pad thereof may be integrated into alternative types of semiconductor packages without departing form the spirit and scope of the present invention.

Using the die pad 14 to create one feature of an arc gap by forming the arc gap extensions 36 thereon in accordance with the present invention is both functional and cost effective. In this regard, the formation of the arc gap extensions 36 on the die pad 14 is a natural extension of the etching process preferably used to fabricate the leadframe 12, and requires only simple design modifications to implement the same. As such, the addition of the arc gap extensions 36 to the leadframe 12 does not increase the cost thereof, though it does increase the value of the leadframe 12 as a packaging solution for many applications.

Figure 4:
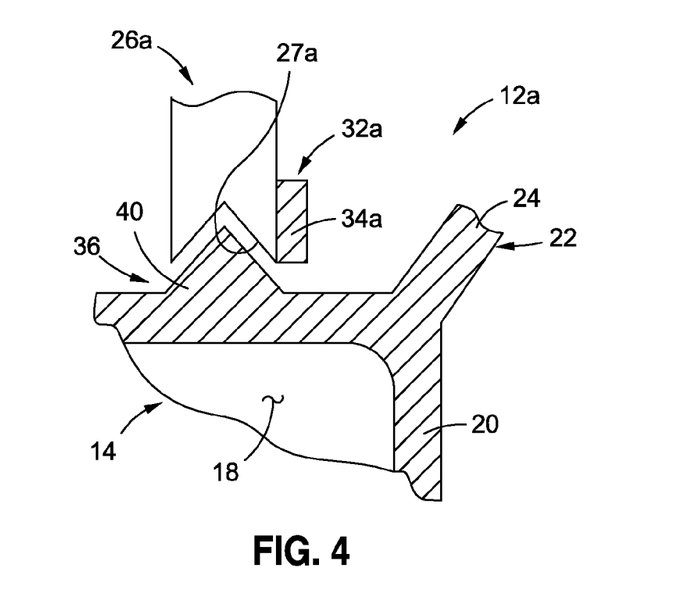
FIG. 4 is a partial, bottom plan view similar to FIG. 3, but showing a variant of the leadframe shown in FIG. 2.

Referring now to FIG. 4, there is shown a portion of leadframe 12a which may be integrated into the semiconductor package 10 as an alternative to the above-described leadframe 12. The sole distinction between the leadframes 12, 12a lies in the structural features of the leads 26a of the leadframe 12a in comparison to the leads 26 of the leadframe 12. More particularly, as seen in FIG. 4, each of the leads 26a is formed to include a generally triangular notch 27a within the inner end thereof disposed closest to a corresponding peripheral edge segment of the die pad 14. The notch 27a has a configuration which is complimentary to that of the adjacent, corresponding arc gap extension 36 of the leadframe 12a. In this regard, each lead 26a is sized such that the corresponding arc gap extension 36 is partially received or nested within the notch 27a in the manner also shown in FIG. 4. However, there is still a prescribed gap or spacing between those surfaces of the lead 26a defining the notch 27a and the corresponding arc gap extension 36 which defines the arc gap 6.

In the leadframe 12a, each lead 26a is further subjected to a partial etching process which results in its inclusion of a locking tab portion 32a which protrudes laterally from one of the side surfaces thereof. The locking tab potion 32a of each lead 26a is preferably about one-half of the total thickness thereof. Each locking tab portion 32a defines a generally planar top surface which extends in substantially coplanar relation to the top surface 16 of the die pad 14, and an etched bottom surface 34a which extends in generally coplanar relation to the shelf 20 of the die pad 14. Similar to the locking tab portions 32 of the leadframe 12, the locking tab portions 32a of the leads 26a in the leadframe 12a are covered by the encapsulant material used to form the package body of a semiconductor package including the leadframe 12a, thus creating a mechanical interlock between the leads 26a and the package body.

Figure 5:
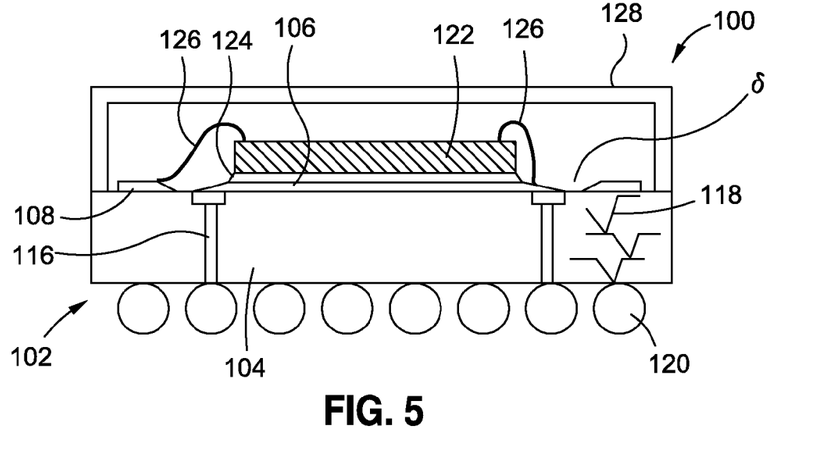
FIG. 5 is a cross-sectional view of a semiconductor package constructed in accordance with a first embodiment of the present invention.
Figure 6:
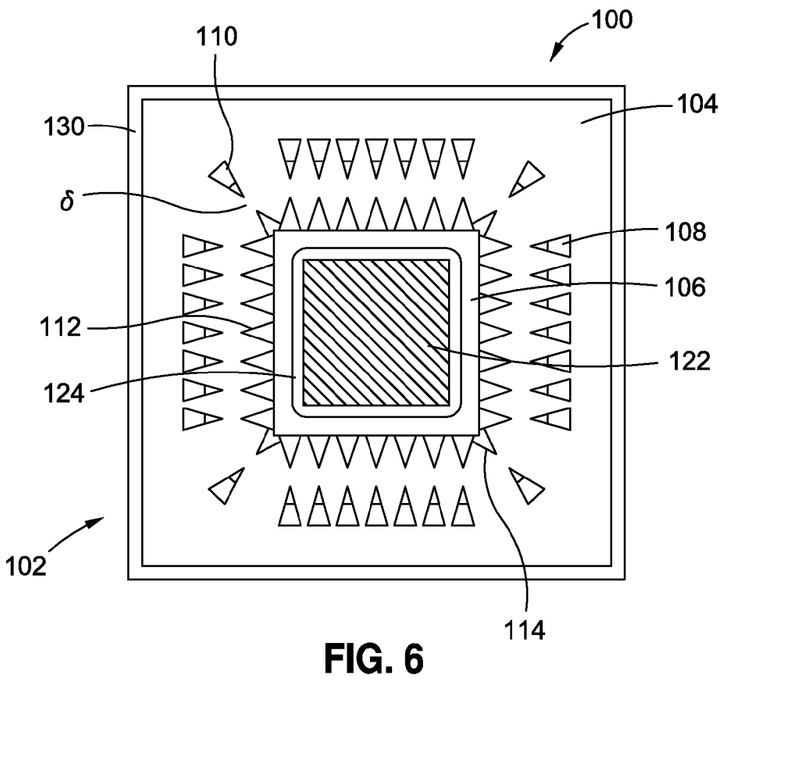
FIG. 6 is a top plan view of the semiconductor package shown in FIG. 5, the semiconductor package being shown in a partially fabricated state prior to the attachment of the lid thereto.

Referring now to FIGS. 5 and 6, there is shown a semiconductor package 100 constructed in accordance with a second embodiment of the present invention. One of the primary distinctions between the semiconductor packages 10, 100 lies in the substitution of the leadframe 12 of the semiconductor package 10 with a laminate substrate 102 in the semiconductor package 100, i.e., the semiconductor package 100 is substrate based rather than leadframe based.

In the semiconductor package 100, the substrate 102 preferably has a generally quadrangular (e.g., square) configuration. The substrate 102 can be selected from common circuit boards (e.g., rigid circuit boards and flexible circuit boards) and equivalents thereof. In this regard, the present invention is not intended to be limited to any particular type of substrate 102. By way of example and not by way of limitation, the substrate 102 may include an insulating layer 104 which, from the perspective shown in FIG. 5, defines opposed, generally planar top and bottom surfaces. Disposed on a central region of the top surface of the insulating layer 104 is a die paddle or die pad 106 of the substrate 102. The die pad 106 has a generally quadrangular (e.g., square) configuration, and defines four peripheral edge segments which extend in spaced, generally parallel relation to respective ones of four peripheral edge segments defined by the insulating layer 104. The substrate 102 further includes a plurality of bond fingers, leads or contacts 108 which are also disposed on the top surface of the insulating layer 104. In the substrate 102, the contacts 108 are preferably segregated into four sets, with each set of the contacts 108 extending along and in spaced relation to a respective one of the peripheral edge segments defined by the die pad 106. As seen in FIG. 6, four (4) additional corner leads or contacts 110 are also formed on the top surface of the insulating layer 104. Each corner contact 110 is located between adjacent sets of the contacts 108. Each of the contacts 108, 110 has a generally triangular configuration. The tip or apex defined by each of the contacts 108 points toward a respective one of the peripheral edge segments of the die pad 106. The tip or apex defined by each of the contacts 110 points toward a respective one of the corner regions of the die pad 106.

In the substrate 102, each of the four peripheral edge segments of the die pad 106 does not have a linear, uninterrupted configuration. Rather, the die pad 106 is formed to include a multiplicity of spark or arc gap extensions 112 which protrude from the peripheral edge segments thereof. More particularly, as best seen in FIG. 6, the arc gap extensions 112 each preferably have a generally triangular configuration, and are segregated into four sets, with each set of the arc gap extensions 112 protruding from a respective one of the four peripheral edge segments defined by the die pad 106. The die pad 106 is further formed to include four (4) additional corner arc gap extensions 114 which also each have a generally triangular configuration. The corner arc gap extensions 114 protrude from respective ones of the four corner regions of the die pad 106.

In the substrate 102, the tip or apex of each arc gap extension 112 is directed toward or points to the apex of a corresponding contact 108, but is separated therefrom by a prescribed arc gap δ. Similarly, the tip or apex of each corner arc gap extension 114 is directed toward or points to the apex of a corresponding corner contact 110, but is separated therefrom by the arc gap δ. Though, as shown in FIG. 6, the number of arc gap extensions 112 included in each set thereof is equal to the number of contacts 108 included in each corresponding set thereof, it is also contemplated that the die pad 106 of the substrate 102 may be formed such that the number of arc gap extensions 112 included thereon is less than the number of contacts 108, with only certain select contacts 108 thus having an arc gap extension 112 aligned therewith. Along these lines, it also contemplated that the corner contacts 110 and corresponding corner arc gap extensions 114 may be eliminated, or that the number of corner arc gap extensions 114 included on the substrate 102 may be less than the number of corner contacts 110. In the substrate 102, the functionality of the arc gaps δ is the same as described above in relation to the semiconductor package 10.

As best seen in FIG. 5, it is contemplated that the arc gap extensions 112, 114 and/or the contacts 108, 110 may each be fabricated so as not to be of uniform thickness. More particularly, the arc gap extensions 112 and/or 114 may each be formed such that the entirety or at least a portion of the top surface thereof slopes or tapers downwardly toward the apex thereof. In the semiconductor package 100 shown FIG. 5, the entirety of the top surfaces of the arc gap extensions 112, 114 slope downwardly between the die pad 106 and the corresponding apex. Similarly, the contacts 108 and/or 110 may each be formed such that the entirety or at least a portion of the top surface thereof slopes or tapers downwardly toward the apex thereof. Though not shown in FIG. 2, it is also contemplated that that the arc gap extensions 36 of the leadframe 12 may each be formed to define similar, downwardly sloping top surfaces.

The substrate 102 further includes a plurality of conductive lands which are disposed on the bottom surface of the insulating layer 104. As seen in FIG. 5, at least one (but typically two or more) of the arc gap extensions 112, 114 is electrically connected to a respective one of the lands through of corresponding, dedicated conductive interconnect via 116 which extends therebetween through the insulating layer 104. Similarly, at least some of the contacts 108, 110 and lands are electrically interconnected to each other in a prescribed pattern or arrangement through the use of conductive interconnect vias 118 which also extend through the insulating layer 104 between the top and bottom surfaces thereof. The semiconductor package 100 further comprises a plurality of solder balls 120 which are electrically connected to the respective ones of the lands of the substrate 102 in a prescribed pattern or arrangement. Examples of suitable materials for the solder balls 120 include, but are not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi), or equivalents thereto. As will be recognized, the solder balls 120 are used to electrically couple the semiconductor package 100 to an external circuit.

The semiconductor package 100 further comprises an integrated circuit or semiconductor die 122 which is attached to the top surface of the die pad 106. More particularly, the semiconductor die 122 defines opposed, generally planar top and bottom surfaces, with the bottom surface of the semiconductor die 122 being attached to the top surface of the die pad 106 through the use of a layer 124 of a suitable adhesive, such as a conductive or non-conductive epoxy or a conductive or non-conductive die attach film. Disposed on a peripheral portion of the top surface of the semiconductor die 122 is a plurality of conductive terminals, at least some of which are electrically connected to the top surfaces of respective ones of the contacts 108, 110 through the use of conductive wires 126. As also shown in FIG. 5, it is also contemplated that wires 126 may also optionally be used to facilitate the electrical connection of at least one of the terminals to a respective one of the arc gap extensions 112, 114.

The semiconductor package 100 further comprises a package cap or lid 128 which is attached to the substrate 102. As seen in FIGS. 5 and 6, the lid 128 defines a peripheral rim which is secured to the periphery of the top surface of insulating layer 104 by a quadrangular (e.g., square) seal ring 130. As apparent from FIG. 5, the lid 128 and the insulating layer 104 are sized such that when secured to each other through the use of the seal ring 130, the outer side surfaces of the lid 128 extend in generally coplanar relation to corresponding peripheral side surfaces of the insulating layer 104. The lid 128 thus covers or shields the semiconductor die 122, as well as the wires 126.

Figure 7:
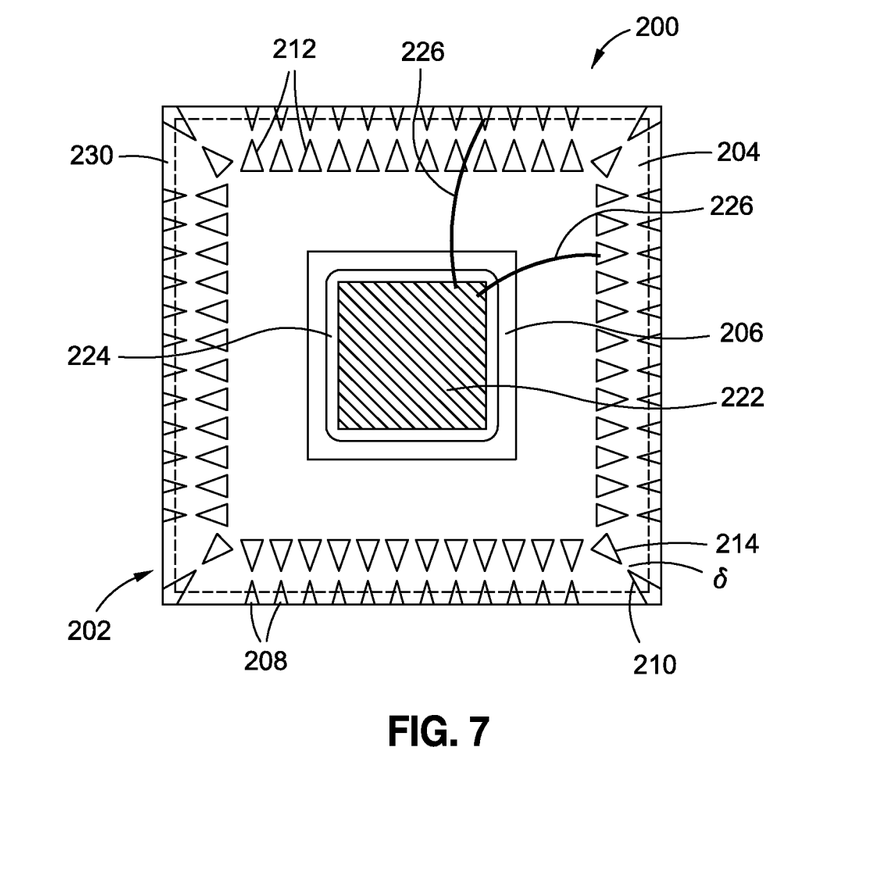
FIG. 7 is a top plan view similar to FIG. 6, but showing a semiconductor package constructed in accordance with a third embodiment present invention.

Referring now to FIG. 7, there is shown a semiconductor package 200 constructed in accordance with a third embodiment of the present invention. The semiconductor package 200 bears a high degree of structural similarity to the semiconductor package 100, and is also substrate based rather than leadframe based.

The semiconductor package 200 includes a substrate 202 which preferably has a generally quadrangular (e.g., square) configuration. The substrate 202 can be selected from common circuit boards (e.g., rigid circuit boards and flexible circuit boards) and equivalents thereof. In this regard, the present invention is not intended to be limited to any particular type of substrate 202. By way of example and not by way of limitation, the substrate 202 may include an insulating layer 204 which defines opposed, generally planar top and bottom surfaces. Disposed on a central region of the top surface of the insulating layer 204 is a die paddle or die pad 206 of the substrate 202. The die pad 206 has a generally quadrangular (e.g., square) configuration, and defines four peripheral edge segments which extend in spaced, generally parallel relation to respective ones of four peripheral edge segments defined by the insulating layer 204. The substrate 202 further includes a plurality of bond fingers, leads or contacts 208 which are also disposed on the top surface of the insulating layer 204. In the substrate 202, the contacts 208 are preferably segregated into four sets, with each set of the contacts 208 extending along and in spaced relation to a respective one of the peripheral edge segments defined by the die pad 106. However, each set of the contacts 208 also extends along and to a respective one of the peripheral edge segments defined by the insulating layer 204. As seen in FIG. 7, four (4) additional corner leads or contacts 210 are also formed on the top surface of the insulating layer 204. Each corner contact 210 is located between adjacent sets of the contacts 208, and extends to a respective one of the corners defined by the insulating layer 204. Each of the contacts 208, 210 has a generally triangular configuration. The tip or apex defined by each of the contacts 208 points toward a respective one of the peripheral edge segments of the die pad 206. The tip or apex defined by each of the contacts 210 points toward a respective one of the corner regions of the die pad 206.

The substrate 202 further includes a plurality of arc gap extensions 212 which are also disposed on the top surface of the insulating layer 204. In the substrate 202, the arc gap extensions 212 are preferably segregated into four sets, with each set of the arc gap extensions 212 extending between and in spaced relation to a respective one of the peripheral edge segments defined by the die pad 206, and a corresponding set of the contacts 208. As seen in FIG. 7, four (4) additional corner arc gap extensions 214 are also formed on the top surface of the insulating layer 204. Each corner arc gap extension 214 is located between adjacent sets of the arc gap extensions 212. Each of the arc gap extensions 212, 214 has a generally triangular configuration.

In the substrate 202, the tip or apex of each arc gap extension 212 is directed toward or points to the apex of a corresponding contact 208, but is separated therefrom by a prescribed arc gap δ. Similarly, the tip or apex of each corner arc gap extension 214 is directed toward or points to the apex of a corresponding corner contact 210, but is separated therefrom by the arc gap δ. Though, as shown in FIG. 7, the number of arc gap extensions 212 included in each set thereof is equal to the number of contacts 208 included in each corresponding set thereof, it is also contemplated that the substrate 202 may be formed such that the number of arc gap extensions 212 included thereon is less than the number of contacts 208, with only certain select contacts 208 thus having an arc gap extension 212 aligned therewith. Along these lines, it also contemplated that the corner contacts 210 and corresponding corner arc gap extensions 214 may be eliminated, or that the number of corner arc gap extensions 214 included on the substrate 202 may be less than the number of corner contacts 210. In the substrate 202, the functionality of the arc gaps δ is the same as described above in relation to the semiconductor package 10.

Though not shown in FIG. 7, it is contemplated that the arc gap extensions 212, 214 and/or the contacts 208, 210 may each be fabricated so as not to be of uniform thickness. More particularly, the arc gap extensions 212 and/or 214 may each be formed such that the entirety or at least a portion of the top surface thereof slopes or tapers downwardly toward the apex thereof. Similarly, the contacts 208 and/or 210 may each be formed such that the entirety or at least a portion of the top surface thereof slopes or tapers downwardly toward the apex thereof.

Though not shown in FIG. 7, the substrate 202 further includes a plurality of conductive lands which are disposed on the bottom surface of the insulating layer 204. It is contemplated that at least one (but typically two or more) of the arc gap extensions 212, 214 will be electrically connected to a respective one of the lands through of corresponding, dedicated conductive interconnect via which extends therebetween through the insulating layer 204. Similarly, at least some of the contacts 208, 210 and lands are electrically interconnected to each other in a prescribed pattern or arrangement through the use of conductive interconnect vias which also extend through the insulating layer 204 between the top and bottom surfaces thereof. The semiconductor package 200 further comprises a plurality of solder balls which are electrically connected to the respective ones of the lands of the substrate 202 in a prescribed pattern or arrangement. As will be recognized, these solder balls are used to electrically couple the semiconductor package 100 to an external circuit.

The semiconductor package 200 further comprises an integrated circuit or semiconductor die 222 which is attached to the top surface of the die pad 206. More particularly, the semiconductor die 222 defines opposed, generally planar top and bottom surfaces, with the bottom surface of the semiconductor die 222 being attached to the top surface of the die pad 206 through the use of a layer 224 of a suitable adhesive, such as a conductive or non-conductive epoxy or a conductive or non-conductive die attach film. Disposed on a peripheral portion of the top surface of the semiconductor die 222 is a plurality of conductive terminals. As shown in FIG. 7, at least some of the terminals are electrically connected to the top surfaces of respective ones of the contacts 208, 210 through the use of conductive wires 226. It is also contemplated that wires 226 may also optionally be used to facilitate the electrical connection of at least one of the terminals to a respective one of the arc gap extensions 212, 214.

Though not shown in FIG. 7, the semiconductor package 200 further comprises a package cap or lid similar to the lid 128 which is attached to the substrate 202. This lid defines a peripheral rim which is secured to the periphery of the top surface of insulating layer 204 by a quadrangular (e.g., square) seal ring 230. The lid and the insulating layer 204 are sized such that when secured to each other through the use of the seal ring 230, the outer side surfaces of the lid extend in generally coplanar relation to corresponding peripheral side surfaces of the insulating layer 204. The lid thus covers or shields the semiconductor die 222, as well as the wires 226 used to electrically connect the same to the substrate 202.

In both the semiconductor packages 100, 200, the typical construction of the insulating layer 104, 204 of the substrate 102, 202 from multiple layers, at least one of which is a ground plane, lends itself to the integration of the arc gap designs such as those described above. These additions do not excessively increase the cost of the semiconductor packages 100, 200, but do increase the value of the packaging solution.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a die pad having at least one arc gap extension protruding outward from at least one peripheral edge segment of the die pad;
    a semiconductor die attached to the die pad; and
    a plurality of leads extending at least partially about the die pad in spaced relation thereto, the semiconductor die being electrically connected to at least some of the leads, with at least one of the leads being aligned with the arc gap extension and separated therefrom by an arc gap which is of a prescribed width, and wherein the at least one arc gap extension has a distal end spaced apart from the die pad and directed toward an inner end of the at least one of the leads.

2. The semiconductor package of claim 1 further comprising a package body covering at least portions of the die pad, the arc gap extension and the leads, portions of the leads being exposed in an exterior surface of the package body.

3. The semiconductor package of claim 2 wherein the semiconductor die is electrically connected to at least some of the leads by conductive wires which are covered by the package body.

4. The semiconductor package of claim 1 further comprising:
    an insulating layer having the die pad, the arc gap extension and the leads formed thereon; and
    a lid which is attached to the insulating Lyer and covers the semiconductor die, the die pad, the arc gap extension and the leads.

5. The semiconductor package of claim 4 wherein the semiconductor die is electrically connected to at least some of the leads by conductive wires which are covered by the lid.

6. The semiconductor package of claim 1 wherein the semiconductor die is further electrically connected to the at least one arc gap extension of the die pad.

7. The semiconductor package of claim 1 wherein the arc gap extension is integrally connected to the die pad.

8. The semiconductor package of claim 7 wherein the arc gap extension has a generally triangular configuration defining an apex that is coplanar with a top surface of the die pad and that extends to the arc gap.

9. The semiconductor package of claim 4, wherein the arc gap extension defines a top surface which slopes downwardly from the die pad to the apex.

10. The semiconductor package of claim 8 wherein the at least one of the leads aligned with the arc gap extension has a generally triangular notch within the inner end thereof, and wherein the arc rap extension is partially received within the notch.

11. The semiconductor package of claim 7 wherein:
the die pad defines opposed top and bottom surfaces, a peripheral edge which circumvents the top surface, and a shelf which is recessed relative to and circumvents the bottom surface; and
the arc gap extension protrudes from the peripheral edge and defines opposed top and bottom surfaces which extend in generally coplanar relation to respective ones of the top surface and the shelf of the die pad.

12. The semiconductor package of claim 7 wherein:
the die pad has a generally quadrangular configuration defining multiple peripheral edge segments, each adjacent pair of which is separated by a corner region;
a plurality of arc gap extensions that are integrally connected to the die pad, the arc gap extensions being segregated into at least four sets which each extend along and protrude outwardly towards leads from a respective one of the peripheral edge segments of the die pad;
each arc gap extension having a distal end directed towards an inner end of a respective lead in spaced relation thereto;
the leads are segregated into at least four sets which each extend along and in spaced relation to a respective one of the peripheral edge segments of the die pad; and
each of the leads is aligned with a respective one of the arc gap extensions and separated therefrom by an arc gap which is of a prescribed width.

13. The semiconductor package of claim 12 further comprising:
a plurality of corner arc gap extensions which protrude from respective ones of the corner regions of the die pad;
a plurality of corner leads disposed between corresponding adjacent sets of the leads; the leads are segregated into at least four sets which each extend along and in spaced relation to a respective one of the peripheral edge segments of the die pad; and
each of the corner leads being aligned with a respective one of the corner arc gap extensions and separated therefrom by an arc gap which is of a prescribed width.

14. A semiconductor package comprising:
a die pad having a generally quadrangular configuration defining multiple peripheral edge segments;
a semiconductor die attached to the die pad;
a plurality of leads segregated into at least four sets that each extend along and in spaced relation to a respective one of the peripheral edge segments of the die pad, each lead has an inner end directed towards the die pad; and
a plurality of arc gap extensions segregated into at least four sets that each extend outward from a respective one of the peripheral edge segments of the die pad and a corresponding set of the leads, at least a portion of the arc gap extensions having distal ends spaced apart from the die pad and directed towards and aligned with the inner end of the lead in spaced relation thereto;
the semiconductor die being electrically connected to at least some of the leads, with each of the leads being separated from a respective one of the arc gap extensions by an arc gap that is of a prescribed width.

15. The semiconductor package of claim 14 further comprising:
an insulating layer having the die pad, the arc gap extensions and the leads formed thereon; and
a lid which is attached to the insulating layer and covers the semiconductor die, the die pad, the arc gap extensions and the leads.

16. The semiconductor package of claim 15 wherein the semiconductor die is electrically connected to at least some of the leads and at least one of the arc gap extensions by conductive wires which are covered by the lid.

17. The semiconductor package of claim 14 wherein each of the arc gap extensions has a generally triangular configuration defining an apex that is coplanar with a top surface of the die pad and that extends to the arc gap.

18. The semiconductor package of claim 17 wherein each of the leads has a generally triangular notch within the inner end thereof and wherein the arc gap extension is partially received within the notch.

19. A semiconductor package comprising:
a die pad defining multiple peripheral edge segments and including a plurality of arc gap extensions integrally connected thereto, the arc gap extensions being segregated into multiple sets that each extend along and protrude outward from a respective one of the peripheral edge segments of the die pad;
a semiconductor die attached to the die pad; and
a plurality of leads segregated into multiple sets that each extend along and in spaced relation to a respective one of the peripheral edge segments of the die pad, the semiconductor die being electrically connected to at least some of the leads, with each of the leads being aligned with a respective one of the arc gap extensions and separated therefrom by an arc gap which is of a prescribed width and wherein the arc gap extensions have distal ends spaced apart from the die pad and directed toward inner ends of the leads in spaced relation thereto.

20. The semiconductor package of claim 19 wherein:
each of the arc gap extensions has a generally triangular configuration defining an apex that is coplanar with a top surface of the die pad and that extends to the arc gap; and
each of the leads has a generally triangular notch within the inner end thereof and wherein the arc gap extension is partially received within the notch.

\* \* \* \* \*